United States Patent
Masuda

(10) Patent No.: US 7,208,838 B2
(45) Date of Patent: Apr. 24, 2007

(54) SEMICONDUCTOR DEVICE, CIRCUIT BOARD, AND ELECTRONIC INSTRUMENT SUITABLE FOR STACKING AND HAVING A THROUGH HOLE

(75) Inventor: Kazuhiro Masuda, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/799,743

(22) Filed: Mar. 15, 2004

(65) Prior Publication Data

US 2004/0251554 A1 Dec. 16, 2004

(30) Foreign Application Priority Data

Mar. 27, 2003 (JP) ............... 2003-088823
Dec. 22, 2003 (JP) ............... 2003-424712

(51) Int. Cl.
*H01L 21/4763* (2006.01)
(52) U.S. Cl. ................. 257/774; 257/E25.013
(58) Field of Classification Search ......... 257/758, 257/774, 776, E23.011, E23.174, E25.013
See application file for complete search history.

(56) References Cited

U.S. PATENT DOCUMENTS

| 6,563,079 B1* | 5/2003 | Umetsu et al. ........ 219/121.71 |
|---|---|---|
| 6,608,371 B2 | 8/2003 | Kurashima et al. |
| 2001/0027011 A1* | 10/2001 | Hanaoka et al. ............ 438/637 |
| 2002/0017710 A1* | 2/2002 | Kurashima et al. ......... 257/686 |
| 2002/0025587 A1* | 2/2002 | Wada ........................... 438/15 |
| 2002/0151169 A1* | 10/2002 | Umetsu et al. ............ 438/629 |
| 2003/0210534 A1* | 11/2003 | Swan et al. ................. 361/807 |

FOREIGN PATENT DOCUMENTS

JP A 2002-50738 2/2002

OTHER PUBLICATIONS

Miyazawa, Ikuya et al. "Development of Die Level Stacked Packaging." International Conference on Electronic Packaging Official Program 2003.
U.S. Appl. No. 10/799,621, filed Mar. 15, 2004, Masuda.

* cited by examiner

*Primary Examiner*—Thomas L. Dickey
(74) *Attorney, Agent, or Firm*—Oliff & Berridge, PLC

(57) ABSTRACT

A semiconductor device includes a semiconductor device body section having a substrate and an electrode formed on the substrate. A through-hole is formed through the electrode and the substrate in a stacking direction of the electrode and the substrate, and a conductive member is inserted into the through-hole. An insulating material which faces at least the through-hole is formed on the electrode. The conductive member is formed over the insulating material from the through-hole and is connected with the electrode.

7 Claims, 10 Drawing Sheets

SEMICONDUCTOR DEVICE, CIRCUIT BOARD, AND ELECTRONIC INSTRUMENT SUITABLE FOR STACKING AND HAVING A THROUGH HOLE

Japanese Patent Application No. 2003-88823, filed on Mar. 27, 2003 and Japanese Patent Application No. 2003-424712, filed on Dec. 22, 2003, are hereby incorporated by reference in their entirety.

BACKGROUND OF THE INVENTION

The present invention relates to a semiconductor device, a circuit board, an electronic instrument, and a method of manufacturing a semiconductor device. More particularly, the present invention relates to a semiconductor device having a configuration suitable for a three-dimensional stacking technology.

In order to reduce the size and weight of a portable electronic instrument such as a portable telephone, a notebook-type personal computer or a personal data assistant (PDA), various electronic parts such as a semiconductor chip provided in the electronic instrument have been reduced in size. Moreover, the space for mounting the electronic parts is extremely limited. Therefore, the package form of the semiconductor chip has been developed, and an extremely small package called a chip scale package (CSP) has been proposed.

Since the mounting area of the semiconductor chip manufactured by using the CSP technology is approximately equal to the area of the semiconductor chip, high-density mounting can be achieved.

However, since the electronic instrument is expected to be further reduced in size and increased in function in the future, it is necessary to increase the mounting density of the semiconductor chip.

In view of the above situation, a three-dimensional stacking technology as disclosed in Japanese Patent Application Laid-open No. 2002-50738 has been proposed. This three-dimensional stacking technology achieves high-density mounting of semiconductor chips by stacking semiconductor chips having the same function or by stacking semiconductor chips having different functions, and interconnecting the semiconductor chips.

In the above-described three-dimensional stacking technology, the technology of interconnecting the semiconductor chips is very important. In order to allow the semiconductor device including a plurality of semiconductor chips to exhibit expected functions, interconnects must be formed conforming to the design, and reliability of the semiconductor device must be secured by securing the connection between the semiconductor chips.

A semiconductor chip used for the three-dimensional stacking technology has an electrode structure in which electrodes are formed on the upper and back surfaces of the semiconductor substrate, a through-hole is formed through the upper and back surfaces of the semiconductor substrate, and the upper and lower electrodes are electrically connected through the through-hole. The electrode formed on the back surface of one semiconductor chip is connected with the electrode formed on the upper surface of another semiconductor chip by stacking the semiconductor chips having such an electrode structure, whereby the semiconductor chips are interconnected.

In such a semiconductor device, the connection state, that is, the electrical connection state between the electrodes, is an important factor in securing reliability of the semiconductor device. In the case where an electrical connection failure occurs, malfunction may occur in the semiconductor device.

On the other hand, since a number of steps are necessary for forming the above-described electrode structure, manufacturing efficiency is decreased. It is indispensable to form the through-hole in the above-described electrode structure. However, the degrees of freedom of design of the semiconductor chip may be limited depending on the formation position of the through-hole. Therefore, it is necessary to form an electrode structure taking the degrees of freedom of design into consideration.

BRIEF SUMMARY OF THE INVENTION

A semiconductor device according to one aspect of the present invention includes a substrate and an electrode formed on the substrate, wherein a through-hole is formed through the electrode and the substrate in a stacking direction of the electrode and the substrate, a conductive member being inserted into the through-hole, wherein an insulating material is disposed between the electrode and the conductive member, the insulating material including a wall portion located higher than at least the electrode, and wherein the conductive member is formed over the wall portion of the insulating material from the through-hole and is connected with the electrode.

A circuit board according to another aspect of the present invention includes the above semiconductor device. An electronic instrument according to a further aspect of the present invention includes the above circuit board.

A method of manufacturing a semiconductor device according to a still further aspect of the present invention includes:

a stacking step of forming an electrode on a substrate;

an electrode hole formation step of forming an electrode hole in the electrode, the electrode hole exposing a surface of the substrate;

a step of forming an insulating layer so as to cover at least a surface in the electrode hole and an upper surface of the electrode;

a step of forming an opening in the insulating layer inside the surface in the electrode hole at a position corresponding to a substrate hole forming section;

a step of forming a substrate hole in the substrate using the insulating layer as a mask, the substrate hole being connected with the electrode hole;

a connection hole formation step of exposing the upper surface of the electrode by forming a hole in the insulating layer in a region differing from the electrode hole; and a conductive member filling step of filling the electrode hole, the substrate hole, and a connection hole in the insulating layer with a conductive member continuously from inside of the electrode hole and the substrate hole to the electrode that has been exposed.

DETAILED DESCRIPTION OF THE EMBODIMENT

Figure 1:
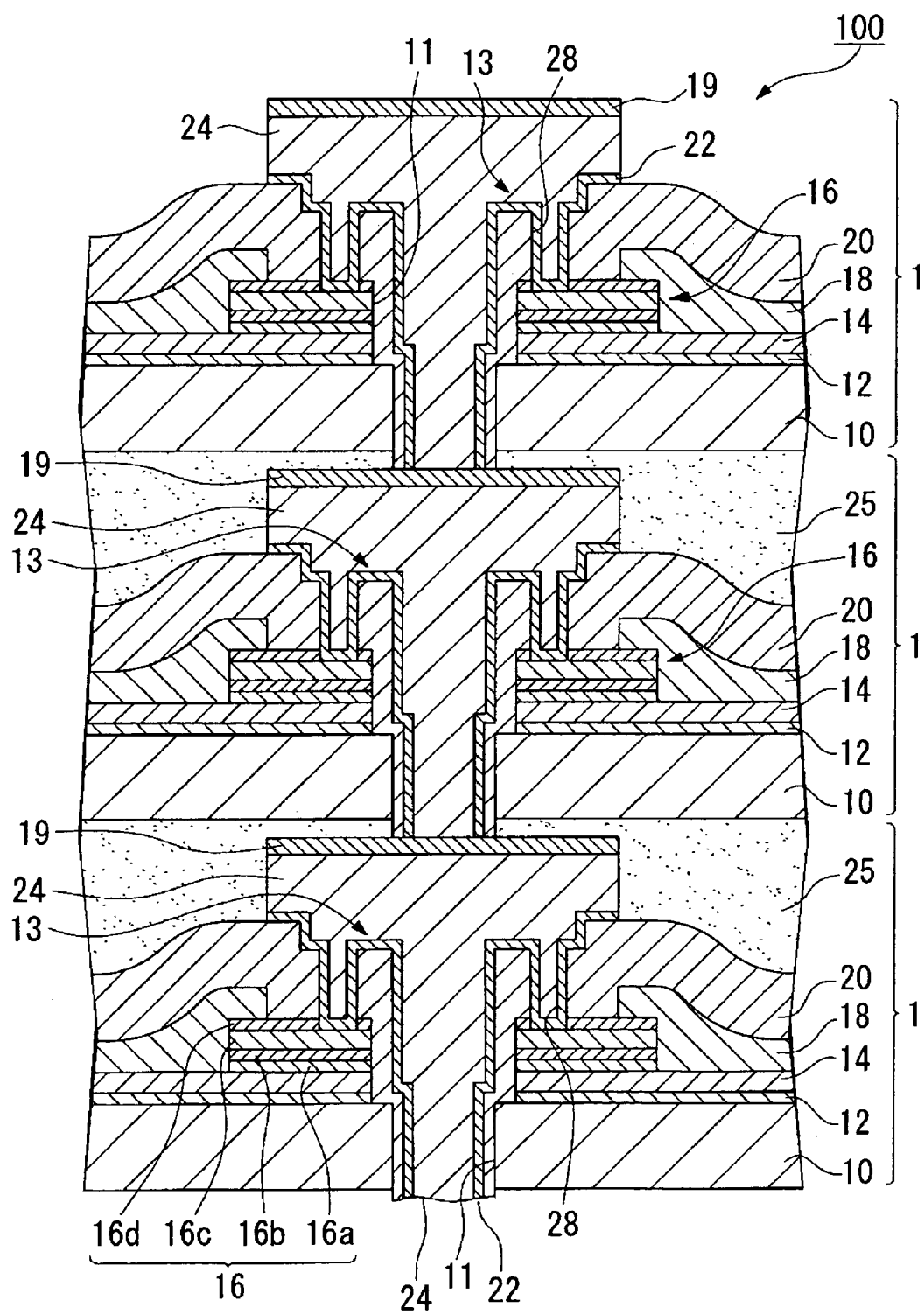
FIG. 1 is a cross-sectional schematic diagram showing a configuration of a semiconductor device according to a first embodiment.

An embodiment of the present invention may provide a highly reliable semiconductor device in which an excellent electrical connection state is secured, a circuit board including the semiconductor device, and an electronic instrument including the circuit board. Another embodiment of the present invention may provide a method of manufacturing a semiconductor device which can improve manufacturing efficiency by reducing the number of steps when forming an electrode structure, reduce the manufacturing cost, increase the degrees of freedom of design, and secure reliability.

A semiconductor device according to one embodiment of the present invention includes a substrate and an electrode formed on the substrate, wherein a through-hole is formed through the electrode and the substrate in a stacking direction of the electrode and the substrate, a conductive member being inserted into the through-hole, wherein an insulating material is disposed between the electrode and the conductive member, the insulating material including a wall portion located higher than at least the electrode, and wherein the conductive member is formed over the wall portion of the insulating material from the through-hole and is connected with the electrode.

According to this semiconductor device, the upper surface and the back surface of the semiconductor device can be connected through the conductive member inserted into the through-hole, and another semiconductor device can be stacked on at least one of the upper surface and the back surface. Therefore, three-dimensional stacking of the semiconductor devices can be realized.

Since the insertion hole (through-hole) for the conductive member which functions as a connection terminal is formed in the electrode, the space of the substrate can be saved in comparison with the case of forming a through-hole in the substrate in the region in which the electrode is not formed, whereby an increase in function and a reduction of size of the semiconductor device can be realized. In the semiconductor device having such a configuration, since the conductive member is connected with the electrode over the wall portion of the insulating material instead of being directly connected with the electrode inside the through-hole, the conductive member is connected with the electrode through the insulating material. Therefore, the conductive member is in contact with both the insulating material and the electrode. In this case, since a level difference is formed on the contact surface between the conductive member and the insulating material and the electrode for at least the height of the wall portion of the insulating material, bonding strength (adhesion) is increased in comparison with the case of connecting the conductive member with the electrode inside and outside the through-hole. As a result, the electrical connection state between the conductive member and the electrode can be stabilized. Therefore, according to this semiconductor device of the present invention, malfunction due to an electrical connection failure rarely occurs, whereby a highly reliable three-dimensionally mounted semiconductor device can be provided.

In the semiconductor device according to the embodiment of the present invention, the insulating material may have a portion disposed on the electrode. It suffices that the insulating material be located at least on the surface of the electrode in the through-hole to insulate the conductive member and the electrode inside and outside the through-hole. The semiconductor device may include an interlayer dielectric between the substrate and the electrode. In this case, the interlayer dielectric includes a through-hole coaxial with the above through-hole.

The insulating material may be formed to cover an upper surface of the electrode and a surface in the through-hole, and may include a connection hole for connecting at least the electrode with the conductive member at a position differing from the through-hole, the wall portion being disposed between the connection hole and the through-hole. In this case, the conductive member is formed to be connected with the connection hole over the wall portion from the through-hole, whereby the connection state can be further stabilized.

With this semiconductor device, at least an interlayer dielectric may be formed between the substrate and the electrode, the through-hole being formed in the interlayer dielectric, and surfaces of the interlayer dielectric and substrate in the through-hole may be formed to have a level difference in a boundary area between the substrate and the interlayer dielectric. In this case, adhesion of the conductive member to the surface in the through-hole is improved due to the level difference, whereby a problem such as removal of the conductive member from the through-hole rarely occurs.

At least an interlayer dielectric may be formed between the substrate and the electrode, the through-hole being formed in the interlayer dielectric, and surfaces of the interlayer dielectric and substrate in the through-hole may be formed straightly in a boundary area between the substrate and the interlayer dielectric. In this case, in the case of plating the surface in the through-hole, the surface in the through-hole can be plated uniformly.

In the semiconductor device according to the embodiment of the present invention, the insulating material has a configuration for stabilizing the connection state between the conductive member and the electrode. In the case where the insulating material is formed on the surface in the through-hole from the electrode to the substrate, occurrence of leakage current inside the through-hole can be prevented.

In this embodiment the present invention, the conductive member has the function of a connection terminal in the axial direction of the through-hole, that is, the function of achieving electrical connection in the vertical direction of the substrate (stacking direction). It is preferable that a part of the conductive member project outward from the through-hole on the side of the substrate opposite to the side on which the electrode is formed. In this case, electrical connection with another section can be easily achieved by using the projecting section.

A circuit board according to another embodiment of the present invention comprises the above semiconductor device. In this case, a highly reliable circuit board with a reduced size can be provided. An electronic instrument according to a further embodiment of the present invention comprises this circuit board. In this case, a highly reliable electronic instrument having a reduced size can be provided.

A method of manufacturing a semiconductor device according a still further embodiment of the present invention, includes:

a stacking step of forming an electrode on a substrate;

an electrode hole formation step of forming an electrode hole in the electrode, the electrode hole exposing a surface of the substrate;

a step of forming an insulating layer so as to cover at least a surface in the electrode hole and an upper surface of the electrode;

a step of forming an opening in the insulating layer inside the surface in the electrode hole at a position corresponding to a substrate hole forming section;

a step of forming a substrate hole in the substrate using the insulating layer as a mask, the substrate hole being connected with the electrode hole;

a connection hole formation step of exposing the upper surface of the electrode by forming a hole in the insulating layer in a region differing from the electrode hole; and a conductive member filling step of filling the electrode hole, the substrate hole, and a connection hole in the insulating layer with a conductive member continuously from inside of the electrode hole and the substrate hole to the electrode that has been exposed.

The semiconductor device according to the above-described embodiment of the present invention can be manufactured by using the manufacturing method including these steps. Specifically, according to the above manufacturing method, a semiconductor device having a configuration in which the conductive member is connected with the electrode over the insulating layer (insulating material) from the electrode hole and the substrate hole (these holes form the through-hole) can be provided. In more detail, a semiconductor device having a configuration in which the conductive member is connected with the electrode in the connection hole over the insulating layer from the through-hole can be provided.

With this method of manufacturing a semiconductor device, the stacking step may further include a step of forming an insulating film on the electrode, and the electrode hole formation step may include a first step of forming an opening in the insulating film formed to cover the electrode in at least a part of an area located on the electrode, and a second step of forming the electrode hole by forming an opening in a part of the electrode using the insulating film in which the opening is formed as a mask.

The following effect is obtained by forming a hole in the substrate using as a mask the insulating layer formed to cover the surface in the electrode hole and the upper surface of the electrode. Specifically, since a conventional photo resist mask has poor dry etching resistance, a resist mask with a thickness of about 10 μm is necessary for forming a hole with a depth of about 70 μm. This not only increases cost due to an increase in the film thickness, but also results in an inefficient process due to an increase in the aspect ratio.

However, the film thickness can be reduced to about several microns (about 2 μm, for example) by using the above-described insulating layer, whereby a reduction of cost and an efficient manufacturing process can be realized. The insulating layer used as a mask may be directly stacked on the electrode, or may be stacked on the electrode with another member interposed.

The substrate hole and the electrode hole may be formed to have approximately the same diameter. In this case, since the surface in the through-hole can be formed straightly, post-processing or post-treatment (plating, for example) can be uniformly performed for the surface in the through-hole.

The opening may be formed so that a diameter D1 of the substrate hole and a diameter D2 of the electrode hole satisfy the relationship D1<D2. When the diameter of the opening in the insulating film is D3, the opening may be formed so that the relationship D1<D2<D3 is satisfied. In this case, since a level difference is formed on the surface in the through-hole, the conductive member formed in the through-hole exhibits improved adhesion to the through-hole due to the level difference.

According to the method of manufacturing a semiconductor device according to the embodiment of the present invention, a hole (through-hole) is formed in the electrode under which an electronic device is not formed, and the conductive member used as an external connection terminal of the semiconductor device is inserted into the hole. Therefore, the area of the semiconductor device can be effectively utilized in comparison with the case where the conductive member is formed at a position differing from the electrode (case where a through-hole is not formed in the electrode), whereby the degrees of freedom of design of the semiconductor device are improved. In the case where the conductive member is formed at a position differing from the electrode, the size of the conductive member may be limited due to the limitation to the mounting area on the substrate. However, in this embodiment the present invention, since a through-hole with a size approximately equal to the size of the electrode can be formed, the connection area with another semiconductor device can be increased. As a result, reliability of the semiconductor device can be improved.

The method of manufacturing a semiconductor device according to the embodiment of the present invention may comprise a semiconductor device stacking step of stacking semiconductor devices obtained by the above method by using the conductive members of the semiconductor devices.

Three-dimensional stacking of highly reliable semiconductor devices can be realized by the above steps, and an extremely small and highly reliable semiconductor device, a circuit board including the semiconductor device, and an electronic instrument including the circuit board can be provided.

In this embodiment the present invention, the shape of the through-hole formed in the semiconductor device (axial cross-sectional shape or opening shape) may be circular or polygonal such as quadrangular. Three-dimensional stacking can also be realized by forming a plurality of through-holes for one electrode and inserting the conductive member into each of the through-holes. In this case, mechanical stability and electrical stability of vertical connection can be improved.

The electrode is generally formed of aluminum as an essential material, but may be formed by using copper or the like. The shape of the electrode differs depending on the design. The electrode may be in the shape of a quadrilateral in which the length of one side is about 100 μm, for example.

Aluminum or copper may be used as material for the conductive member with which the through-hole is filled. A Cu damascene method may be employed when filling the through-hole with copper. Specifically, the conductive member may be formed by filling the through-hole with copper using a CVD method, an electroplating method, or the like, and polishing and removing the surface of the copper using CMP. In the case of using copper as the conductive member as a connection terminal, a reduction of resistance suitable for a high-speed device is realized, whereby an extremely advantageous semiconductor device can be obtained.

The embodiments of the present invention are described below with reference to the drawings. In this embodiment the present invention, each layer and each material are scaled so that each layer and each material have a size recognizable in the drawings.

FIG. 1 is a partial cross-sectional schematic diagram showing a major portion of a semiconductor device of first embodiment. A semiconductor device 100 is formed by three-dimensionally mounting semiconductor device body sections 1, each having a configuration in which an electrode pad 16 is stacked on a silicon substrate 10 with an interposed insulating film 12 made of a thermal oxide film and an interlayer dielectric 14 made of $SiO_2$.

In the semiconductor device body section 1, the insulating film 12 with a thickness of about 4,000 Å, the interlayer dielectric 14 with a thickness of about 10,000 Å, and the electrode pad 16 with a thickness of about 8,000 Å are stacked on the silicon substrate 10. The semiconductor device body section 1 includes a through-hole 11 which is formed through the silicon substrate 10, the insulating film 12, the interlayer dielectric 14, and the electrode pad 16 in the stacking direction. A connection terminal 24 made of a conductive member is inserted into the through-hole 11. A passivation film 18 having an opening with a diameter greater than the diameter of the through-hole 11 in the electrode pad 16 is formed on the electrode pad 16. An insulating layer 20 is stacked on the electrode pad 16 and the passivation film 18. The insulating layer 20 includes a connection hole 28 on the electrode pad 16 in a region in which the passivation film 18 is not formed, and an insulating wall portion 13 which faces the through-hole 11. The insulating layer 20 is formed to extend from the electrode pad 16 to the surface in the through-hole 11. The insulating layer 20 is located between the electrode pad 16 and the connection terminal 24 to insulate the electrode pad 16 from the connection terminal 24.

In more detail, the insulating layer 20 is formed to cover the upper surface of the electrode pad 16 and the surface in the through-hole 11. The insulating layer 20 includes the connection hole 28 for connecting at least the electrode pad 16 with the connection terminal 24 at a position differing from the through-hole 11 on the surface of the substrate 10. The insulating wall portion 13 is disposed between the connection hole 28 and the through-hole 11. The insulating wall portion 13 includes at least a circular projecting section which projects from the surface of the electrode pad 16 along the surface in the through-hole 11. The insulating wall portion 13 includes a hole coaxial with the through-hole 11.

The connection terminal 24 is inserted into the hole in the insulating layer 20 including the insulating wall portion 13 through a base film 22. The connection terminal 24 formed inside the through-hole 11 is connected with the electrode pad 16 in the connection hole 28 over the insulating wall portion 13 of the insulating layer 20 from the through-hole 11. In the present embodiment, a level difference is formed on the surface in the through-hole 11 near the boundary between the substrate 10 and the insulating film 12. A level difference is also formed on the contact surface of the connection terminal 24 with the hole. The opening shape of the through-hole 11 (cross-sectional shape perpendicular to the hole axis) is circular. However, the opening shape of the through-hole 11 may be polygonal such as quadrangular.

The electrode pad 16 is formed by stacking a first layer 16a made of Ti with a thickness of 100 Å, a second layer 16b made of TiN with a thickness of about 1,000 Å, a third layer 16c made of AlCu with a thickness of about 5,000 Å, and a fourth layer 16d (cap layer) made of TiN with a thickness of about 400 Å in that order. The insulating layer 20 including the insulating wall portion 13 is formed on the surface in the hole in the electrode pad 16 as described above. The connection terminal 24 is planarly connected with the electrode pad 16 through the connection hole 28 over the insulating wall portion 13 from the through-hole 11. Specifically, the connection terminal 24 provided in the through-hole 11 covers the insulating wall portion 13 of the insulating layer 20 selectively formed on the electrode pad 16 at a position facing the through-hole 11, and is also provided in the connection hole 28 formed in the insulating film 20 at a position differing from the surface of the through-hole 11 so as to be connected with the electrode pad 16. The connection hole 28 exposes the third layer 16c through the fourth layer 16d (cap layer) of the electrode pad 16.

A plurality of the connection holes 28 used to connect the electrode pad 16 with the connection terminal 24 may be formed for one electrode pad 16. In this case, mechanical bonding strength between the electrode pad 16 and the connection terminal 24 is increased, whereby connection stability is improved.

A plating thin film 19 made of tin-silver is formed on the upper surface of the connection terminal 24. The semiconductor device body sections are stacked and connected through the plating thin film 19. In the semiconductor device body section 1, the connection terminal 24 is formed to project from the through-hole 11 in the silicon substrate 10 to some extent. The projecting section is connected with the connection terminal of another semiconductor device body section through the plating thin film. The space between the stacked semiconductor device body sections is filled with an underfill 25.

According to the semiconductor device 100 of the present embodiment, the upper surface and the back surface of the semiconductor device body section 1 can be connected through the connection terminal 24 inserted into the through-hole 11, and another semiconductor device body section can be stacked on at least one of the upper surface and the back surface. Therefore, the semiconductor device body sections 1 can be three-dimensionally mounted. Since the through-hole 11 is formed in the electrode pad 16, space can be saved in comparison with the case of forming a through-hole on the silicon substrate 10 in a region in which the electrode pad 16 is not formed, whereby an increase in function and a reduction in size of the semiconductor device can be realized.

In the semiconductor device 100 of the present embodiment, the connection terminal 24 is connected with the electrode pad 16 over the insulating wall portion 13 which projects from the electrode pad 16 along the surface in the through-hole 11 instead of directly connecting the connection terminal 24 inside the through-hole 11 with the electrode pad 16 through the surface of the through-hole 11. Therefore, the connection terminal 24 is connected with the electrode pad 16 over the insulating wall portion 13, that is, the connection terminal 24 is in contact with both the insulating wall portion 13 and the electrode pad 16. In this case, a level difference for at least the thickness of the insulating wall portion 13 (for the amount of the section projecting from the electrode pad 16) is formed on the contact surface between the connection terminal 24 and the insulating wall portion 13 and the electrode pad 16, whereby adhesion of the connection terminal 24 to the insulating wall portion 13 and the electrode pad 16 is increased in comparison with the case of causing the connection terminal 24 to adhere straightly with the insulating wall portion 13 and the electrode pad 16 without forming a level difference. As a result, the electrical connection state between the connection terminal 24 and the electrode pad 16 can be stabilized. Therefore, malfunction of the semiconductor device 100 due to an electrical connection failure rarely occurs, whereby reliability of the semiconductor device 100 is improved.

An example of a method of manufacturing the semiconductor device 100 shown in FIG. 1 is described below. FIGS. 2A to 6B are cross-sectional views showing steps relating to the present invention among a series of manufacturing steps of the semiconductor device 100. The present embodiment illustrates the case of performing various types of processing for a semiconductor substrate, such as a silicon wafer, as an example. However, the processing described below may be performed for an individual semiconductor chip instead of performing the processing for the semiconductor substrate in which a number of semiconductor chips are formed. The semiconductor chip is generally in the shape of a rectangular parallelepiped (including a cube). However, the shape of the semiconductor chip is not limited. The semiconductor chip may be cylindrical (including spherical).

Figure 2A:
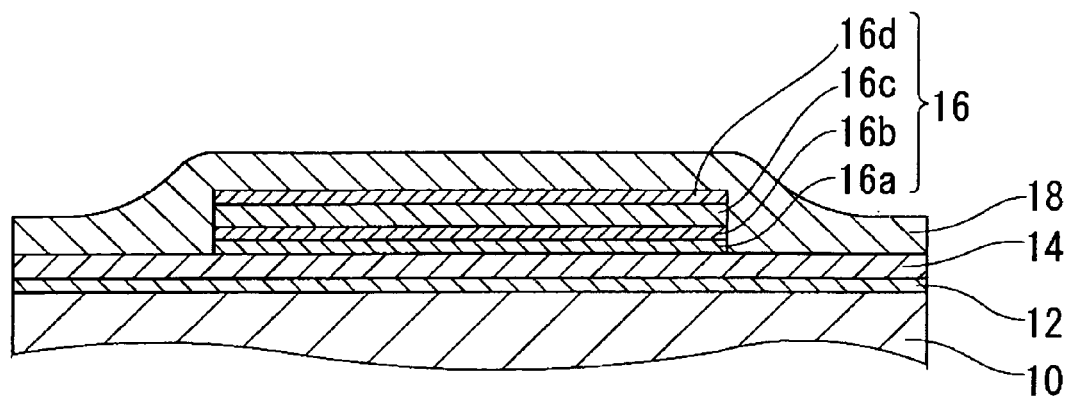
FIGS. 2A to 2C are cross-sectional schematic diagrams showing steps in a manufacturing process of the semiconductor device shown in FIG. 1.

The configuration of the semiconductor substrate as the processing target is described below. In FIG. 2A, the insulating film 12 is formed on the surface of the substrate 10 (silicon substrate) in which an integrated circuit including a transistor, a memory device, and other electronic devices (not shown) are formed. The insulating film 12 is formed of an oxide film ($SiO_2$) of silicon (Si) which is an essential material for the substrate 10, for example.

The interlayer dielectric 14 is formed of borophosphosilicate glass (hereinafter called "BPSG") on the insulating film 12, for example. In a semiconductor device having a multilayer interconnect structure, in the case where the semiconductor device has a three-layer interconnect structure, an interlayer dielectric 14a and an interlayer dielectric 14b are further stacked on the interlayer dielectric 14. Specifically, in the case where the semiconductor device has an n-layer multilayer interconnect structure, n layers of interlayer dielectrics are stacked (not shown). A silicon oxide film or a low-dielectric-constant film with a thickness of 5,000 to 10,000 Å is used as the interlayer dielectric. The electrode pad 16 as an electrode electrically connected with the integrated circuit (not shown) formed in the substrate 10 is formed on the interlayer dielectric 14. The electrode pad 16 is formed by stacking the first layer 16a made of titanium (Ti), the second layer 16b made of titanium nitride (TiN), the third layer 16c made of aluminum/copper (AlCu), and the fourth layer 16d (cap layer) made of TiN in that order.

The electrode pad 16 is formed by forming a stacked structure consisting of the first layer 16a to the fourth layer 16d on the entire surface of the interlayer dielectric 14 by sputtering or the like, and patterning the stacked structure into a given shape (circular shape, for example) using a resist or the like. The present embodiment illustrates the case where the electrode pad 16 is formed by the above stacked structure as an example. The electrode pad 16 may be formed only of aluminum. However, it is preferable to form the electrode pad 16 using copper with low electrical resistance. The configuration of the electrode pad 16 is not limited to the above-described configuration. The configuration of the electrode pad 16 may be appropriately changed depending on necessary electrical characteristics, physical characteristics, and chemical characteristics.

The electrode pads 16 are formed along at least one side (two or four sides in many cases) of the surface of each of a plurality of semiconductor chips formed in the substrate 10. The electrode pads 16 may be formed along the side of the surface of the semiconductor chip, or may be formed at the center of the semiconductor chip. The electronic circuit is not formed under the electrode pad 16.

The passivation film 18 as a protective layer is formed on the interlayer dielectric 14 so as to cover the electrode pad 16. The passivation film 18 may be formed of silicon oxide ($SiO_2$), silicon nitride (SiN), a polyimide resin, or the like.

The steps performed for the semiconductor substrate having the above-described configuration are described below. A resist (not shown) is applied to the entire surface of the passivation film 18 shown in FIG. 2A using a spin coating method, a dipping method, a spray coating method, or the like. The resist is used to form an opening in the passivation film 18 which covers the electrode pad 16. The resist may be any of a photoresist, an electron beam resist, and an X-ray resist. The resist may be either a positive-tone resist or a negative-tone resist.

Figure 2B:
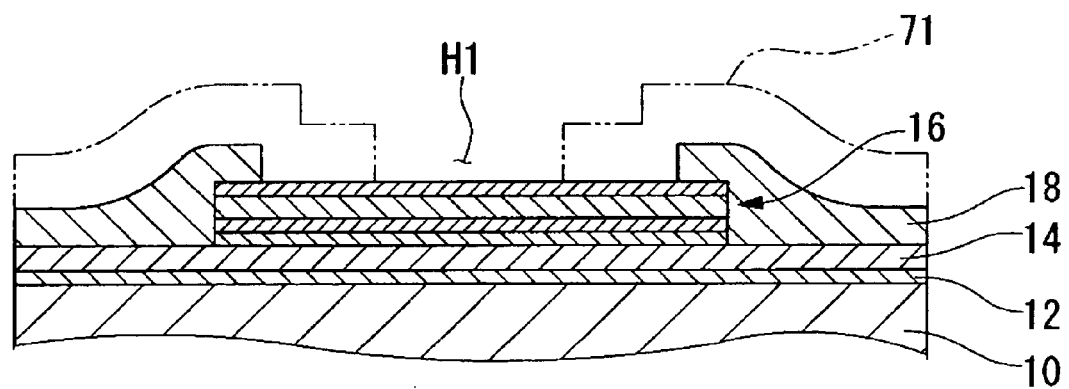

After applying the resist to the passivation film 18, prebaking is performed. The resist is then patterned into a given shape by performing exposure and development using a mask in which a given pattern is formed. The shape of the resist is set corresponding to the shape of the opening in the electrode pad 16. In more detail, the resist has a circular opening with a diameter of 60 µm. After patterning the resist, post baking is performed. As shown in FIG. 2B, a part of the passivation film 18 which covers the electrode pad 16 is etched to form an opening H1. FIG. 2B is a cross-sectional view showing the state in which the opening H1 is formed by forming an opening in the passivation film 18.

It is preferable to etch the passivation film 18 by dry etching. The dry etching may be reactive ion etching (RIE). Wet etching may also be applied. The cross-sectional shape of the opening H1 formed in the passivation film 18 is set corresponding to the shape of the opening formed in the electrode pad 16 in a step described later. The diameter of the opening H1 is set to be greater than the diameter of the opening formed in the electrode pad 16.

Figure 2C:
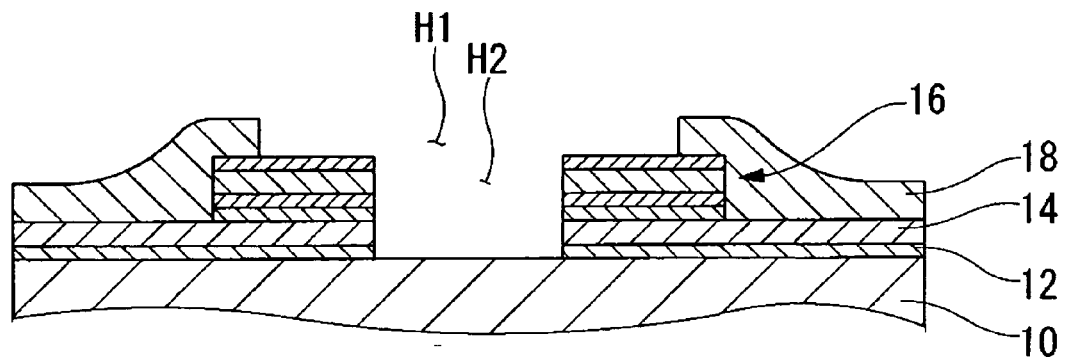

After the above-described steps are completed, an opening is formed in the electrode pad 16, the interlayer dielectric 14, and the insulating film 12 by dry etching using a resist 71 formed on the passivation film 18, in which the opening H1 is formed, as a mask. FIG. 2C is a cross-sectional view showing the state in which an opening H2 is formed by forming an opening in the electrode pad 16, the interlayer dielectric 14, and the insulating film 12. RIE may be used as dry etching.

In this example, an opening is formed in the electrode pad 16, the interlayer dielectric 14, and the insulating film 12 in the single step. However, after forming an opening in the electrode pad 16, an opening may be formed in the interlayer dielectric 14 and the insulating film 12 in another step. In the above-described process, etching is repeatedly performed using a single resist mask. However, the resist may be patterned after each etching step is completed. The resist may be removed after forming the opening H2 in the electrode pad 16, and the substrate 10 may be exposed as shown in FIG. 2C by etching the interlayer dielectric 14 and the insulating film 12 using the outermost surface (TiN) of the electrode pad 16 as a mask.

The surface of the substrate 10 is exposed as shown in FIG. 2C by the above-described steps. The resist formed on the passivation film 18 used as the mask for forming an opening is removed by using a removal solution or by ashing or the like.

Figure 8:
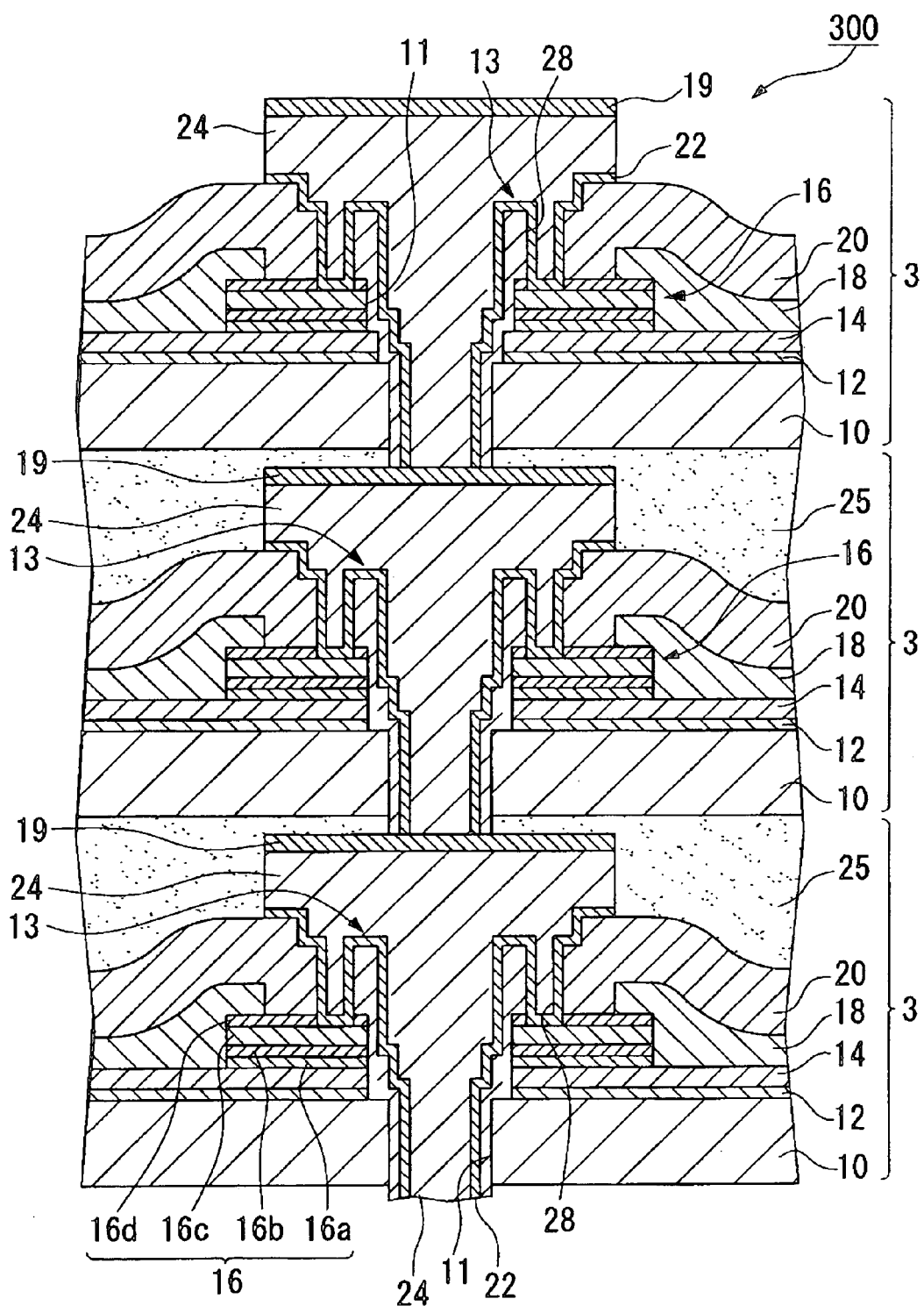
FIG. 8 is a cross-sectional schematic diagram showing a configuration of a modification of a semiconductor device.

A semiconductor device 300 including semiconductor device body sections 3 as shown in FIG. 8 can be provided by forming an opening in the interlayer dielectric 14 and the insulating film 12 in another step after forming an opening in the electrode pad 16, for example. Specifically, the diameter of the through-hole formed in the electrode pad 16 differs from the diameter of the through-hole formed in the interlayer dielectric 14 and the insulating film 12. As a result, a level difference is formed on the surface in the through-hole 11 near the boundary between the electrode pad 16 and the interlayer dielectric 14. In this case, a problem such as removal of the connection terminal 24 from the through-hole 11 rarely occurs, whereby stability of the connection state can be improved.

Figure 3A:
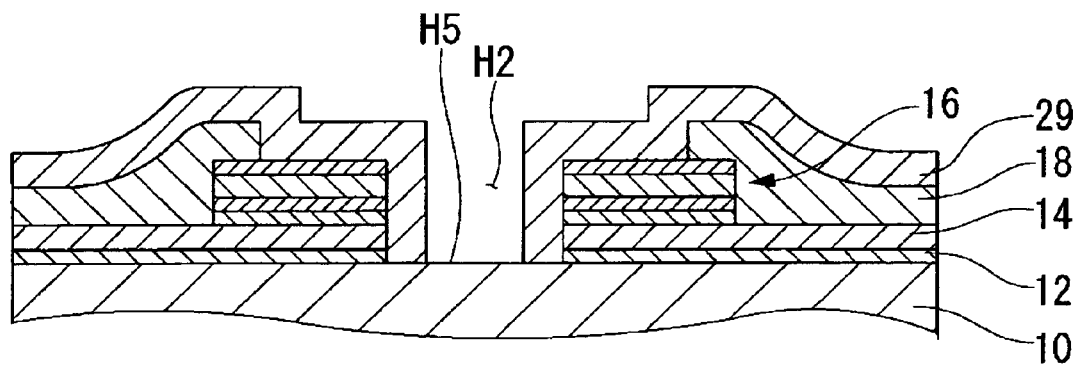
FIGS. 3A and 3B are cross-sectional schematic diagrams showing the steps after the step shown in FIG. 2C in the manufacturing process of the semiconductor device.

As shown in FIG. 3A, an etching hard mask 29 for forming a hole in the substrate 10 is formed. The hard mask 29 is formed to cover the upper surfaces of the passivation film 18 and the electrode pad 16 and the surface in the opening H2. The hard mask 29 may be formed of an insulating material such as $SiO_2$ using a CVD method or the like. After forming the hard mask 29 on the entire surface, an opening H5 is formed in the hard mask 29 at the bottom of the opening H2, as shown in FIG. 3A, to expose the surface of the substrate 10 in the opening H2. In this example, a hole is formed in the hard mask 29 by etching using a resist having an opening corresponding to the opening H5.

It is preferable to etch the hard mask 29 by dry etching. The dry etching may be reactive ion etching (RIE).

Figure 3B:
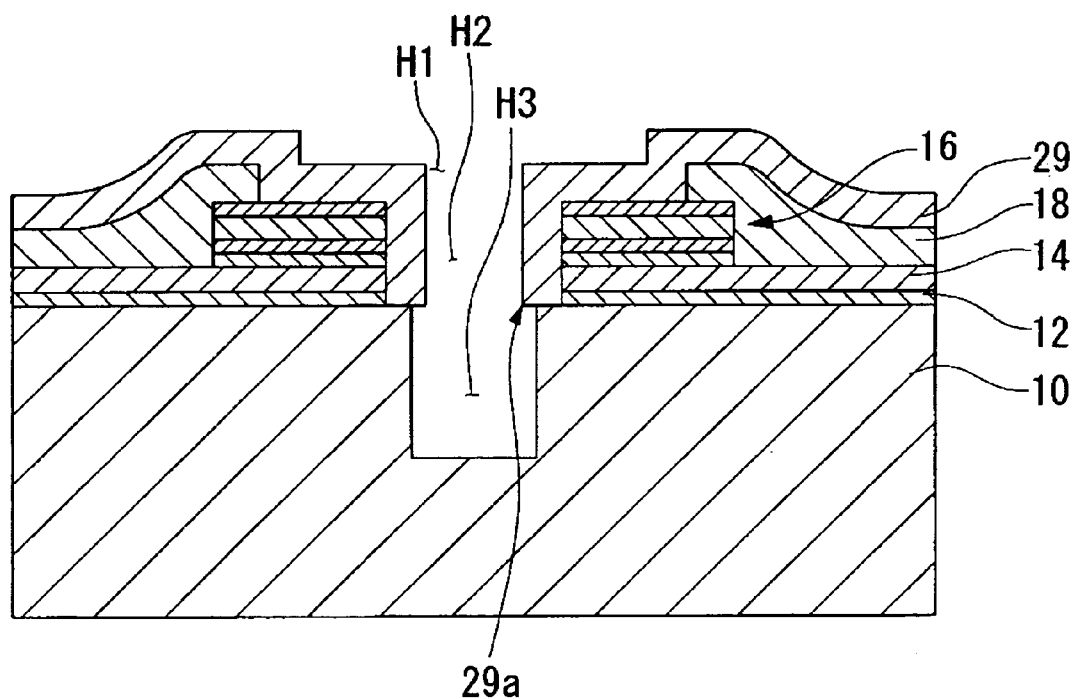

A hole is formed in the substrate 10 by dry etching using the hard mask 29 having the opening H5, as shown in FIG. 3B. As dry etching, inductively coupled plasma (ICP) may be used instead of RIE. FIG. 3B is a cross-sectional view showing the state in which a hole H3 is formed by forming a hole in the substrate 10. The diameter of the opening H5 in the hard mask 29 is set at 30 to 50 μm (30 μm, for example) taking over-etching (side-etching) when forming a hole in the substrate into consideration.

In this example, since the hole is formed in the substrate 10 using the hard mask 29 formed on the passivation film 18, the electrode pad 16, and the surfaces in the openings H1 and H2 as a resist mask, the diameter of the hole H3 formed in the substrate 10 is smaller than the diameter of the opening H2 formed in the electrode pad 16, as shown in FIG. 3B. As a result, a level difference formed by the projecting section of the substrate 10 is formed in the through-hole formed by connecting the openings H1 and H2 and the hole H3.

In the case of forming a hole with a depth of about 70 μm in the substrate 10, it is necessary to form a silicon oxide film using tetraethyl orthosilicate ($Si(OC_2H_6)_4$: hereinafter called "TEOS") as a raw material utilizing plasma enhanced chemical vapor deposition (PECVD) (PE-TEOS method) to a thickness of about 2 μm as the hard mask 29. As the formation method of the hard mask 29, an $O_3$-TEOS method in which a silicon oxide film $SiO_2$ is formed by using ozone and TEOS utilizing a thermal CVD method, or an $SiH_4$—$N_2O$ or $SiH_4$—$O_2$ plasma enhanced CVD method may be used instead of the PE-TEOS method. The thickness of the hard mask 29 is reduced by the substrate hole formation step. The thickness of the hard mask 29 is reduced to about 1,000 to 9,000 Å after the substrate hole formation step. Specifically, in the present embodiment, the thickness of the hard mask 29 is set to be greater than the amount of over-etching.

Since a conventional photo resist mask has poor dry etching resistance, a resist mask with a thickness of about 10 μm is necessary to form a hole with a depth of 70 μm. This increases cost due to an increase in the thickness of the resist mask, and results in an inefficient process due to an increase in the aspect ratio. However, the film thickness can be reduced by using the hard mask 29, whereby a reduction of cost and an efficient manufacturing process can be realized.

In the present embodiment, the shape of the opening H5 in the hard mask 29 is circular. However, the shape of the opening H5 may be polygonal such as quadrangular. PFC dry etching or BHF wet etching is suitably used as the opening formation process.

Figure 4A:
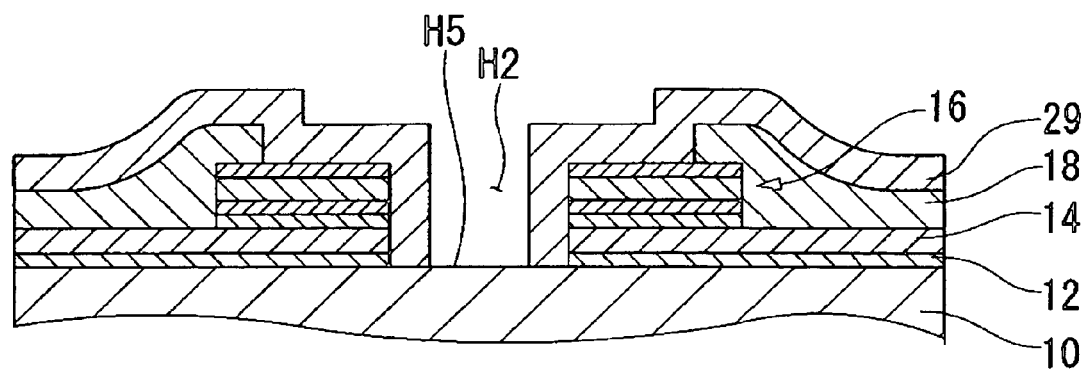
FIGS. 4A and 4B are cross-sectional schematic diagrams showing the steps after the step shown in FIG. 3B in the manufacturing process of the semiconductor device.

After the above-described steps are completed, a projecting section 29a of the hard mask 29 remaining so as to project inward from the surface in the hole H3 is removed by etching. Specifically, the projecting section 29a of the hard mask 29 remaining on the inner wall of the opening in the electrode pad 16, the interlayer dielectric 14, and the insulating film 12 is selectively removed by etching so that the thin hard mask 29 remains on the inner wall of the opening in the electrode pad 16, the interlayer dielectric 14, and the insulating film 12, as shown in FIG. 4A. FIG. 4A is a cross-sectional view showing the state in which the hard mask 29 is allowed to remain on the electrode pad 16 and the inner wall of the opening H2. The thin hard mask 29 can be formed (allowed to remain) on the inner wall of the opening in the electrode pad 16, the interlayer dielectric 14, and the insulating film 12 so as to have an opening diameter greater than the diameter of the hole H3 by etching the hard mask 29 as described above. In this case, the diameter of the opening in the thin hard mask 29 formed in the electrode pad 16 corresponds to the diameter of the hole formed in the substrate and the diameter of the hole formed in the electrode. For example, when the diameter of the hole in the substrate is 30 μm and the diameter of the opening in the electrode is 60 μm, the diameter of the opening in the thin hard mask 29 formed in the electrode pad 16 is about 40 to 58 μm (50 μm, for example).

Figure 4B:
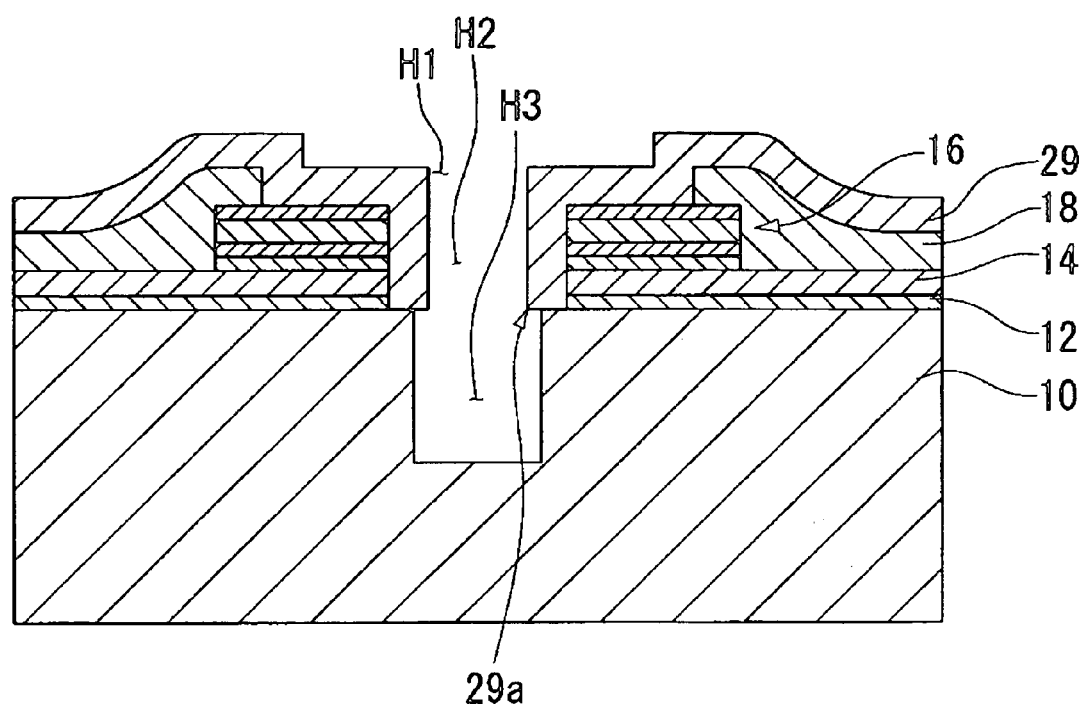

After removing the resist for removing the projecting section 29a, an insulating film is formed on the hard mask 29 and inside of the hole H3. In this example, a silicon oxide film is formed to a thickness of about 1 to 3 μm using the PE-TEOS method. As a result, the insulating film 20 is formed inside the through-hole 11 formed through the substrate 10, the insulating films 12 and 14, and the electrode pad 16, as shown in FIG. 4B. The insulating film 20 may be a silicon nitride film formed to a thickness of about 1 to 3 μm using a plasma CVD method. The insulating film 20 may be formed by forming (stacking) the silicon oxide film and the silicon nitride film to a thickness of about 1 to 3 μm in total. In the case of forming the insulating film 20 by stacking the silicon oxide film and the silicon nitride film, the silicon oxide film may be formed at a position closer to the substrate 10 than the silicon nitride film by forming the silicon nitride film after forming the silicon oxide film.

A resist (not shown) is applied to the insulating film 20. The resist is used to form an opening on a part of the electrode pad 16. After applying the resist, prebaking is performed. The resist is then patterned into a shape in which the resist remains in the area excluding the area over the electrode pad 16 and the hole H3 and its peripheral section, such as a circular shape around the hole H3 (including the peripheral section) by performing exposure and development using a mask in which a given pattern is formed.

Figure 5A:
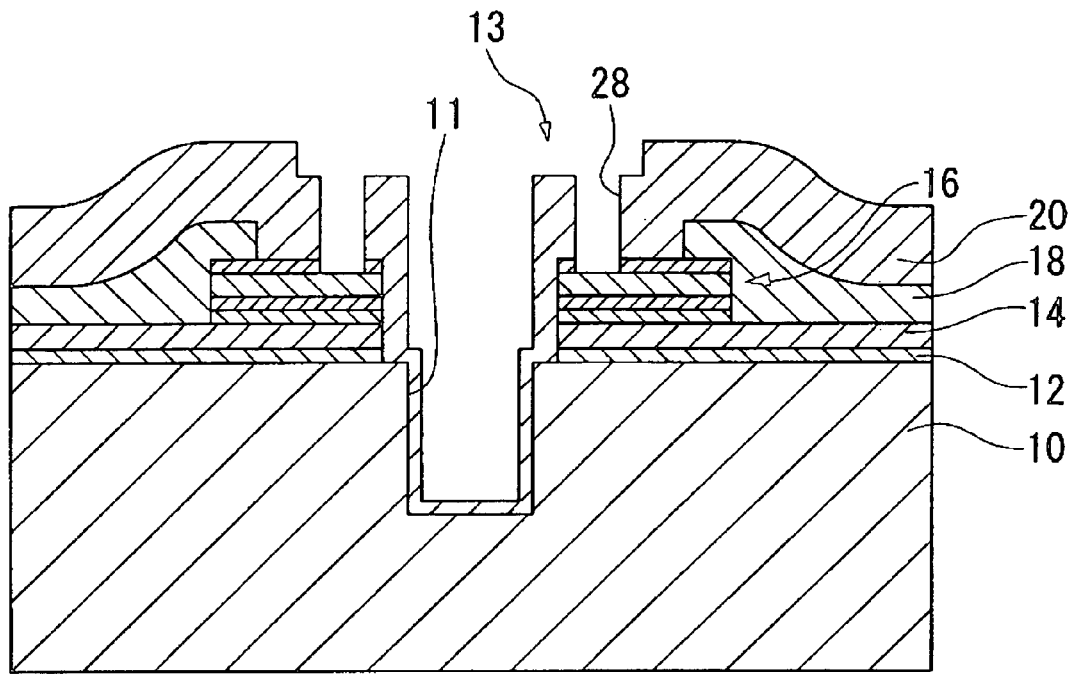
FIGS. 5A and 5B are cross-sectional schematic diagrams showing the steps after the step shown in FIG. 4B in the manufacturing process of the semiconductor device.

After the resist is patterned, post baking is performed. As shown in FIG. 5A, the connection hole is formed on a part of the electrode pad 16 in a state in which the insulating wall portion 13 remains around the opening in the electrode pad 16 by removing a part of the insulating film 20 which covers the electrode pad 16 by etching. FIG. 5A is a cross-sectional view showing the state in which a part of the insulating film 20 which covers the electrode pad 16 is removed. As shown in FIG. 5A, the connection hole 28 is formed in the region excluding the peripheral section of the opening in the electrode pad 16, whereby a part of the electrode pad 16 is exposed. A connection terminal (electrode section) formed in a step described later can be connected with the electrode pad 16 through the connection hole 28.

Figure 5B:
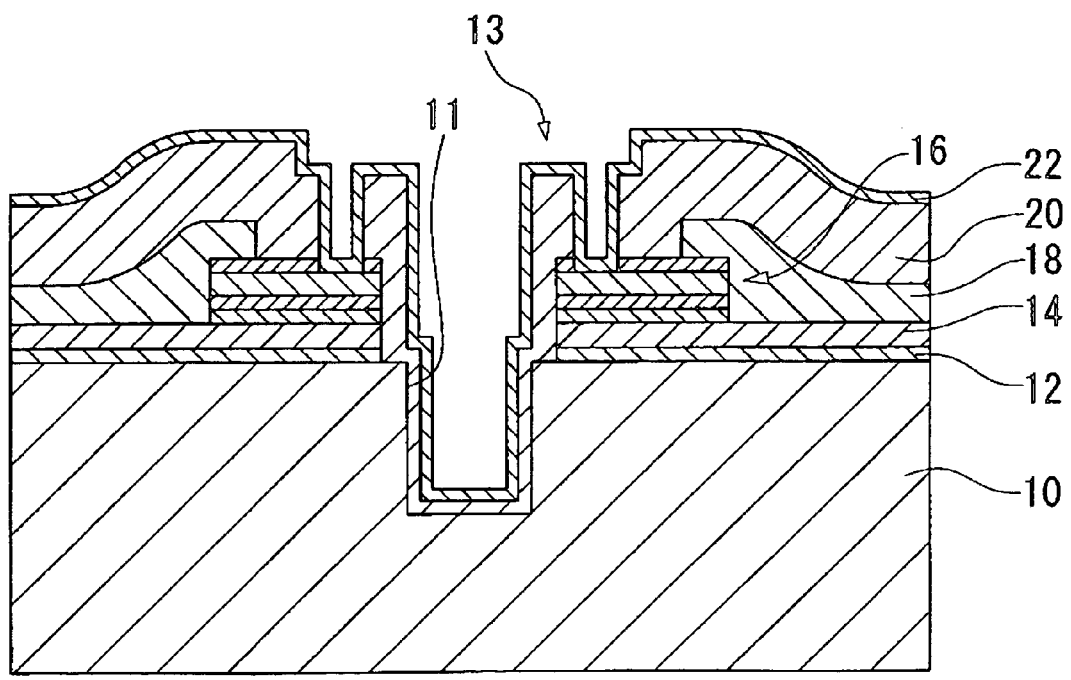

After the above-described steps are completed, the base film 22 including a barrier layer and a seed layer is formed on the surface of the insulating film 20, the exposed section of the electrode pad 16, and the inner surface and the bottom of the through-hole 11. FIG. 5B is a cross-sectional view showing the state in which the base film 22 is formed. As shown in FIG. 5B, the base film 22 is continuously formed on the electrode pad 16 and the insulating film 20 so as to sufficiently cover the insulating wall portion 13 and the surface in the connection hole 28.

After the base film 22 is formed, a resist for forming a connection terminal is applied. The base film 22 is plated by using an electrochemical plating (ECP) method including the area inside the through-hole 11 and the connection hole 28 to fill the through-hole 11 with copper, and the connection hole 28 is also filled with copper over the insulating wall portion 13, whereby the connection terminal 24 is formed. As a result, the connection terminal 24 is electrically connected with the electrode pad 16 in the connection hole 28 in the region differing from the through-hole 11, whereby the connection terminal 24 is formed as an external electrode on the upper surface of the substrate 10.

Figure 6A:
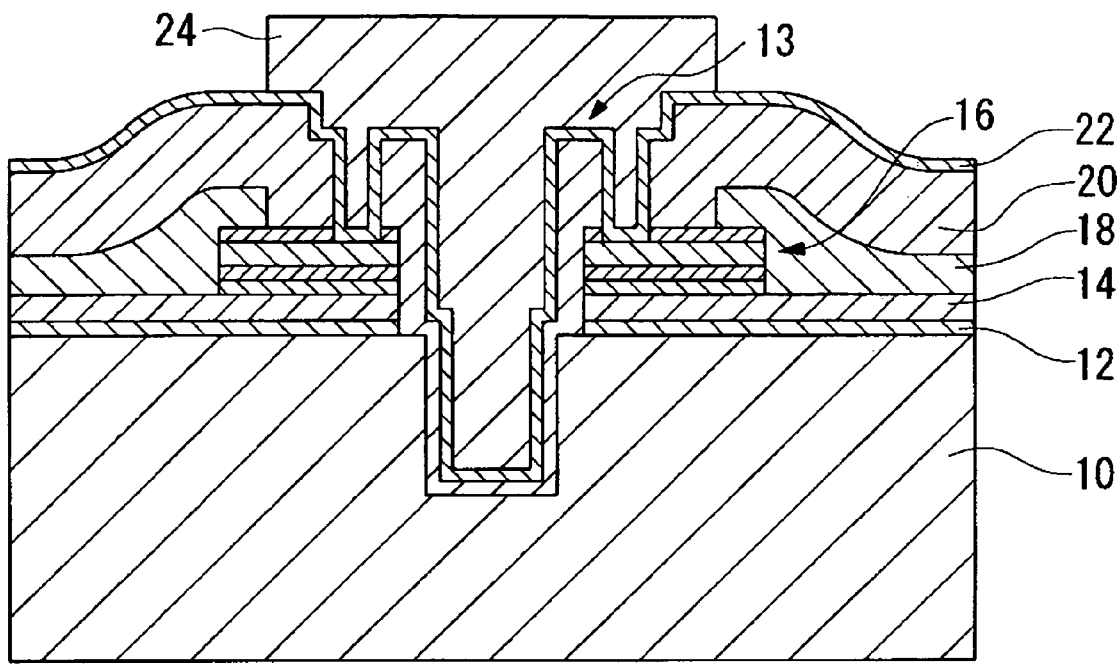
FIGS. 6A and 6B are cross-sectional schematic diagrams showing the steps after the step shown in FIG. 5B in the manufacturing process of the semiconductor device.
Figure 6B:
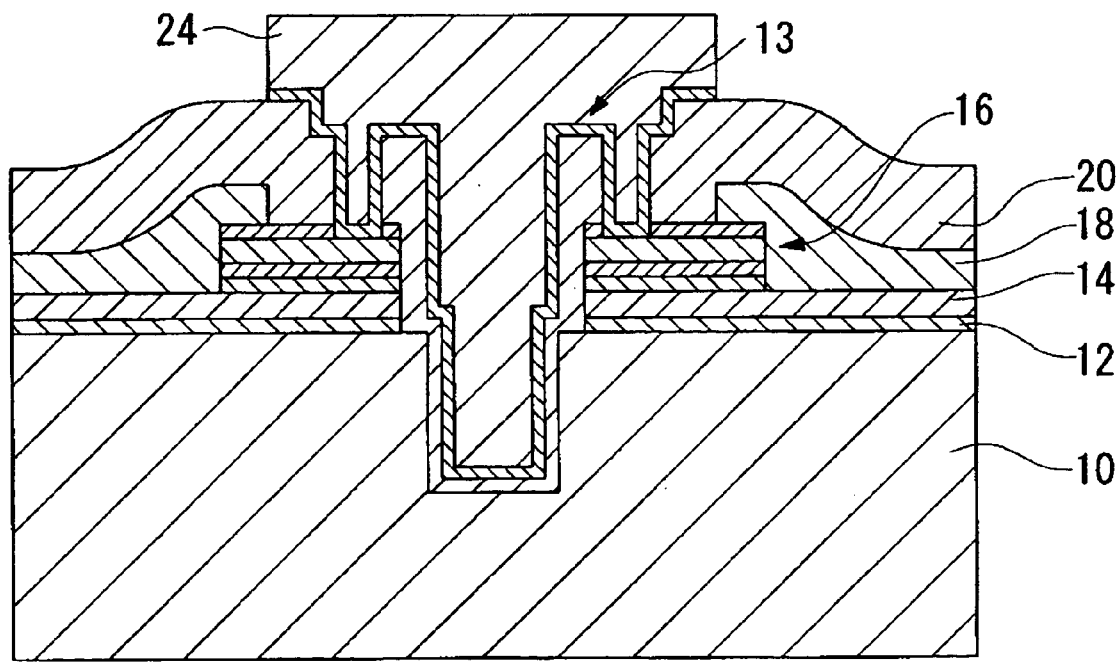

The resist is then removed, and an unnecessary portion of the barrier layer and the seed layer (not shown) is removed by etching, whereby the state as shown in FIG. 6B is formed.

The semiconductor device body section manufactured by the above-described steps is ground on the back surface of the substrate 10 until the connection terminal 24 is exposed from the back surface of the substrate 10, whereby an electrode electrically connected with the exposed connection terminal 24 is formed. The connection terminal 24 may be exposed from the back surface of the substrate 10 by grinding the back surface of the substrate 10 near the connection terminal 24, and etching the back surface of the substrate 10 so that the connection terminal 24 is exposed. A three-dimensional stacking type (stacked type) semiconductor device which enables high-density mounting can be manufactured by stacking the semiconductor device body sections in which the electrodes are formed on the upper surface and the back surface of the substrate 10, or by stacking at least one semiconductor device body section in which the electrodes are formed on the upper surface and the back surface of the substrate 10 and another semiconductor device body section, and interconnecting the semiconductor device body sections.

The semiconductor device body sections may be stacked by bonding the electrodes of the adjacent upper and lower semiconductor device body sections while securing electrical connection between the electrodes using a filler metal such as solder. An adhesive may be used merely for bonding the semiconductor device body sections. The adhesive may be a liquid or gelled adhesive or an adhesive sheet. The adhesive may contain an epoxy resin as an essential material, or be an insulating adhesive.

In the case where the semiconductor device body sections are bonded and electrically connected by using an adhesive, an adhesive containing a conductive substance may be used. The conductive substance includes particles of a filler metal or solder, and is dispersed in an adhesive material. The particles function as braze when bonding the connection targets, whereby bonding cability can be further improved.

The adhesive may be an anisotropic conductive adhesive (ACA) in which conductive particles are dispersed, such as an anisotropic conductive film (ACF) or anisotropic conductive paste (ACP). The anisotropic conductive adhesive is a product in which conductive particles (fillers) are dispersed in a binder. A dispersing agent may be added to the anisotropic conductive adhesive. A heat-curable adhesive is generally used as the binder for the anisotropic conductive adhesive. In this case, conductive particles are present between the interconnect pattern and the electrode to achieve electrical connection between the interconnect pattern and the electrode.

The electrodes may be electrically connected by using a metal junction such as Au—Au, Au—Sn, or solder. For example, these materials are provided to the electrode, and the electrodes are bonded by applying heat, ultrasonic vibration, or ultrasonic vibration and heat. After the electrodes are bonded, the material provided to the electrode is diffused due to vibration or heat, whereby a metal junction is formed.

An external terminal is connected with the connection terminal 24 of the semiconductor device body section located at the bottom (or top) of the three-dimensional stacking type semiconductor device formed by stacking the semiconductor device body sections. The external terminal may be formed by using solder or a metal. However, the material for the external terminal is not limited thereto. It suffices that the external terminal be formed of a conductive material. A solder ball is not necessarily provided. A semiconductor module may be formed by mounting the semiconductor device body section on a substrate. An electrical connection may be achieved by utilizing surface tension during melting of solder cream applied to a motherboard when mounting the semiconductor device body section on the motherboard, without forming a solder ball.

As described above, according to the method of manufacturing a semiconductor device of the present embodiment, an opening is formed in the passivation film 18, and the opening H2 is formed in the electrode pad 16. A hole is formed in the substrate 10 by using the hard mask 29 which is formed on the upper surface of the passivation film 18, the inner wall of the opening in the passivation film 18, and the inner wall of the opening in the electrode pad 16, the interlayer dielectric 14, and the insulating film 12, and has the opening H5 at the bottom of the opening. Therefore, a level difference can be formed on the surface in the through-hole in the stacking direction from the substrate 10 to the electrode pad 16, whereby the connection terminal 24 formed in the through-hole can be prevented from being removed.

Moreover, according to the present embodiment, since the connection terminal 24 is formed by forming the opening H2 (through-hole 11) in the electrode pad 16 disposed in the region in which the semiconductor device is not formed, the area of the semiconductor device can be effectively utilized in comparison with the case of forming the connection terminal 24 at a position differing from the formation position of the electrode pad 16, whereby the degrees of freedom of design of the semiconductor device are improved. In the case where the connection terminal 24 is formed at a position differing from the formation position of the electrode pad 16, the size of the connection terminal 24 may be limited. However, since the size of the connection terminal 24 can be made approximately equal to the size of the electrode pad 16 in the present embodiment, the area connected with another semiconductor device is increased, whereby reliability of the semiconductor device can be improved.

In the present embodiment, copper is used as the conductive member which forms the connection terminal 24. A Cu damascene method may be used when filling the opening with copper. Specifically, the connection terminal 24 may be formed by filling the hole H3 with copper by using a CVD method, an electroplating method, or the like, and polishing and removing the surface of the copper by using CMP. The connection terminal 24 may be formed by using aluminum or the like other than copper as an essential material.

Figure 7:
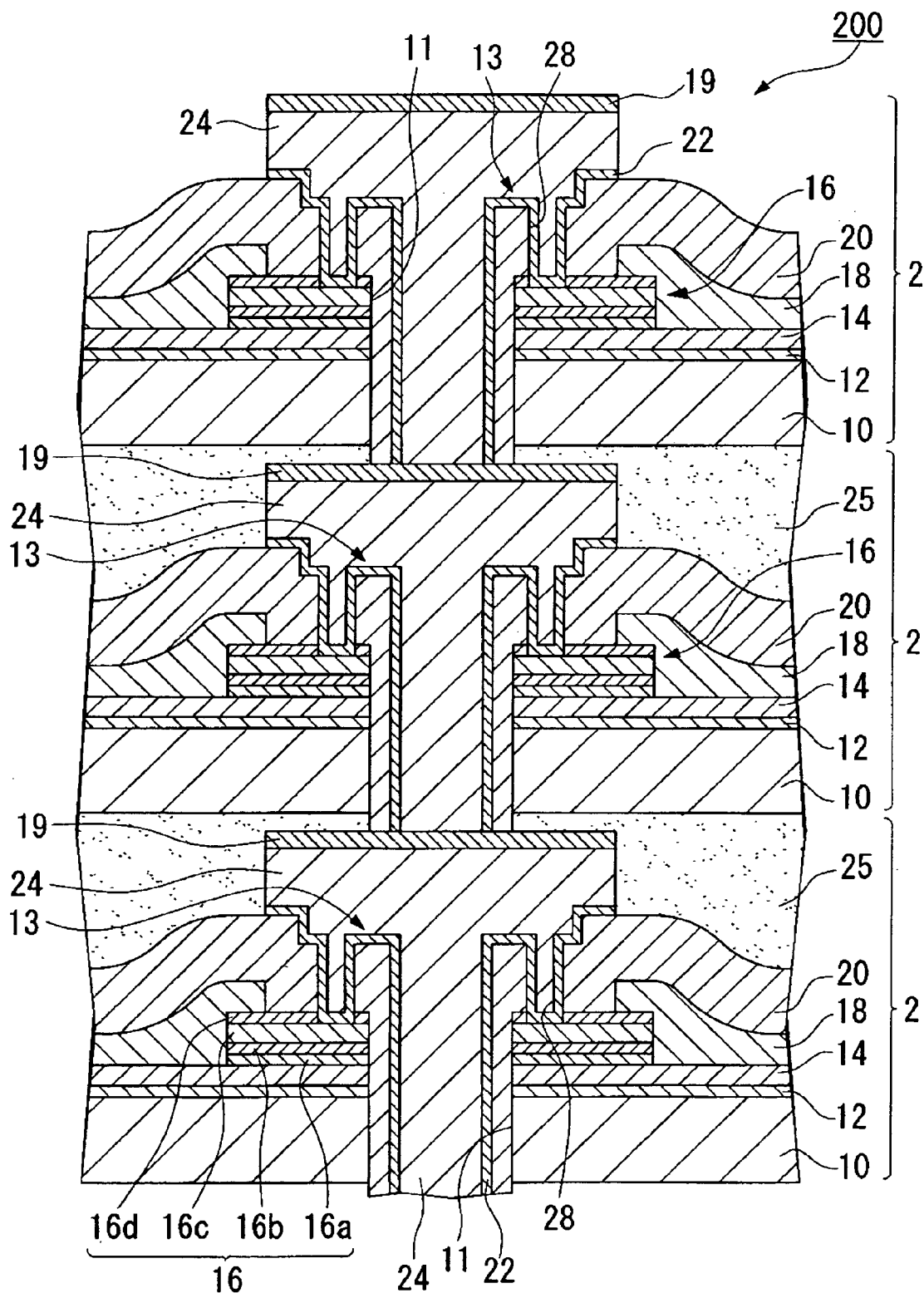
FIG. 7 is a cross-sectional schematic diagram showing a configuration of a semiconductor device according to a second embodiment of the present invention.

A second embodiment of a semiconductor device of the present invention is described below. FIG. 7 is a partial cross-sectional schematic diagram showing a major portion of a semiconductor device of the second embodiment. FIG. 7 corresponds to FIG. 1 in the first embodiment. A semiconductor device 200 of the second embodiment is formed by stacking a plurality of semiconductor device body sections 1, each having a configuration in which the electrode pad 16 is stacked on the silicon substrate 10 with the insulating film 12 and the interlayer dielectric 14 interposed. The second embodiment differs from the first embodiment in that the through-hole 11 is formed straightly through the silicon substrate 10, the insulating film 12, the interlayer dielectric 14, and the electrode pad 16. Therefore, the sections the same as the sections shown in FIG. 1 are indicated by the same symbols. Description of these sections is omitted.

A semiconductor device body section 2 includes the through-hole 11 which is formed straightly through the silicon substrate 10 and the electrode pad 16 in the stacking direction of the silicon substrate 10 and the electrode pad 16. The connection terminal 24 made of a conductive member is inserted into the through-hole 11. According to the semiconductor device 200 of the present embodiment, since the surface in the through-hole 11 is formed straightly in a state in which a level difference is not formed, plating or the like for the surface in the through-hole 11 is facilitated, whereby a uniform thin film can be formed in comparison with the case where a level difference is formed.

In the present embodiment, the upper surface and the back surface of the semiconductor device body section 2 can be connected through the connection terminal 24 inserted into the through-hole 11, and another semiconductor device body section can be stacked on at least one of the upper surface and the back surface. Therefore, the semiconductor device body sections 2 can be three-dimensionally mounted. Moreover, since the through-hole 11 is formed in the electrode pad 16, space can be saved in comparison with the case of forming a through-hole on the silicon substrate 10 in the region in which the electrode pad 16 is not formed, whereby an increase in function and a reduction of size of the semiconductor device can be realized.

In the semiconductor device 200 of the present embodiment, the connection terminal 24 is plarnarly connected with the electrode pad 16 over the insulating wall portion 13 which projects from the electrode pad 16 along the surface in the through-hole 11 instead of directly connecting the connection terminal 24 inside the through-hole 11 with the electrode pad 16. Therefore, the connection terminal 24 is connected with the electrode pad 16 over the insulating wall portion 13, that is, the connection terminal 24 is in contact with both the insulating wall portion 13 and the electrode pad 16. In this case, a level difference for at least the thickness of the insulating wall portion 13 is formed on the contact surface between the connection terminal 24 and the insulating wall portion 13 and the electrode pad 16, whereby adhesion of the connection terminal 24 to the insulating wall portion 13 and the electrode pad 16 is increased in comparison with the case of causing the connection terminal 24 to adhere straightly with the insulating wall portion 13 and the electrode pad 16 without forming a level difference. As a result, the electrical connection state between the connection terminal 24 and the electrode pad 16 can be stabilized.

In the method of manufacturing the semiconductor device 200 shown in FIG. 7, it is preferable that the step of forming an opening in the electrode pad 16 and the insulating films 12 and 14 and the step of forming a hole in the substrate 10 be performed in a single step. This enables the diameter of the opening in each layer to be approximately the same, whereby the through-hole 11 with no or only a small level difference can be formed. In the case where a level difference is formed even in the case of using such a method, the level difference may be removed by etching.

After performing the step of forming a hole in the substrate 10, the insulating film 20 as shown in FIG. 4B and the connection hole 28 and the base film 22 as shown in FIG. 5 are formed, and the openings are filled with the connection terminal 24 to obtain the semiconductor device body section 2 in which a level difference is not formed in the through-hole 11.

Figure 9:
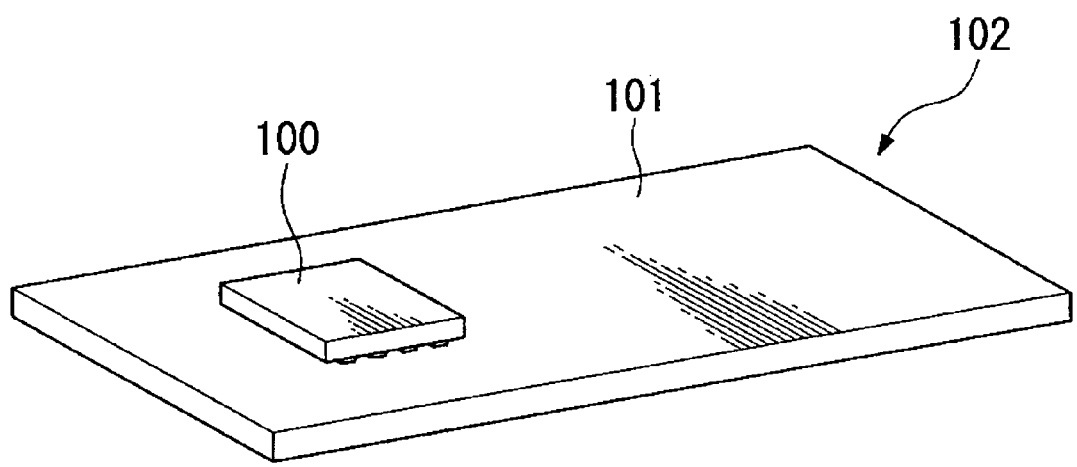
FIG. 9 is a perspective view showing a schematic configuration of a circuit board according to a third embodiment of the present invention.

FIG. 9 is an oblique view showing a schematic configuration of an embodiment of a circuit board of the present invention. As shown in FIG. 9, a circuit board 102 of the present embodiment has a configuration in which the semiconductor device 100 (200, 300) is mounted on a substrate 101. An organic substrate such as a glass epoxy substrate is generally used as the substrate 101. An interconnect pattern is formed of copper or the like on the substrate 101 so that a desired circuit is formed. The interconnect pattern is mechanically connected with the interconnect pattern of the semiconductor device 100, or electrically connected with the interconnect pattern of the semiconductor device 100 using an anisotropic conductive film as described above.

Figure 10:
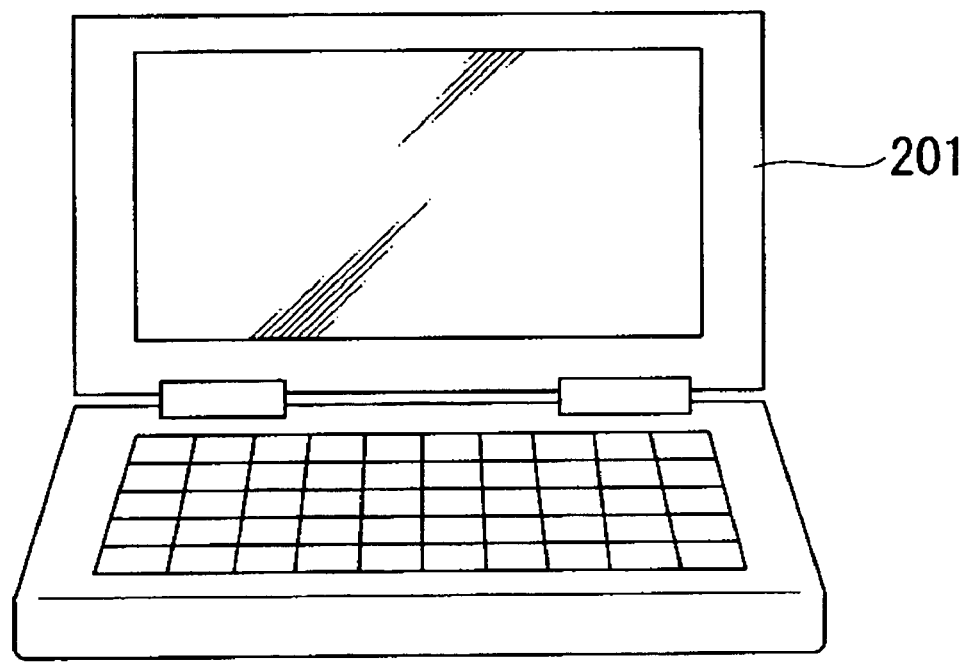
FIG. 10 shows a schematic configuration of an embodiment of an electronic instrument.

FIG. 10 shows a notebook-type personal computer 201 as an electronic instrument including the circuit board including the semiconductor device of the present embodiment. The circuit board shown in FIG. 9 is disposed in the casing of the electronic instrument.

The electronic instrument is not limited to the notebook-type computer and the portable telephone. The circuit board may be applied to various electronic instruments. For example, the circuit board may be applied to an electronic instrument such as a liquid crystal projector, multimedia personal computer (PC) and engineering workstation (EWS), pager, word processor, television, view finder or direct view finder video tape recorder, electronic notebook, electronic desk calculator, car navigation system, POS terminal, and a device including a touch panel.

What is claimed is:

1. A semiconductor device comprising:
   a substrate having a first through-hole formed therein;
   an electrode being formed on the substrate, the electrode having a second through-hole formed therein that overlaps with the first through-hole, the second through-hole being larger than the first through-hole;

an interlayer dielectric being formed between the substrate and the electrode, the interlayer dielectric having a third through-hole formed therein that overlaps with the first and second through-holes, the third through-hole being larger than the first through-hole;

a conductive member being inserted into the first, second and third through-holes, the conductive member having a first portion positioned in the first through-hole and a second portion positioned in the second and third through-holes, the second portion positioned in the second and third through-holes, the second portion having a larger diameter than the first portion; and an insulating material being disposed around the conductive member in the first, second and third through-holes the insulating material including a wall portion located higher than at least the electrode, the conductive member being formed over the wall portion of the insulating material from the first, second and third through-hole and being connected with the electrode.

2. The semiconductor device as defined in claim 1, wherein the insulating material is formed to cover an upper surface of the electrode, and includes a connection hole for connecting at least the electrode with the conductive member at a position differing from the first, second and third through-holes, the wall portion being disposed between the connection hole and the first, second and third through holes.

3. The semiconductor device as defined in claim 1, wherein the conductive member functions as a connection terminal which secures electrical connection in an axial direction of the through-hole.

4. The semiconductor device as defined in claim 1, wherein a part of the conductive member projects outward from the first, second and third through-holes on a side of the substrate opposite to a side on which the electrode is formed.

5. A semiconductor device comprising a plurality of the semiconductor devices as defined in claim 1 which is stacked, each of the semiconductor devices being electrically connected through the conductive member.

6. A circuit board comprising the semiconductor device as defined in claim 1.

7. An electronic instrument comprising the circuit board as defined in claim 6.

* * * * *